United States Patent
Yang

[19]

[11] Patent Number: 5,901,403
[45] Date of Patent: May 11, 1999

[54] SCRUBBER BRUSH

[75] Inventor: Ming-Cheng Yang, Taipei, Taiwan

[73] Assignee: Winbound Electronics, Corp., Hsinchu, Taiwan

[21] Appl. No.: 08/814,970

[22] Filed: Mar. 11, 1997

[51] Int. Cl.[6] .................................................. A46B 7/08
[52] U.S. Cl. ................................. 15/180; 15/77; 15/102; 15/88.2
[58] Field of Search ............................ 15/3, 77, 28, 97.1, 15/102, 88.1, 88.2, 201, 180; 451/514, 519, 518, 523

[56] References Cited

U.S. PATENT DOCUMENTS

| | | | |
|---|---|---|---|
| 1,681,648 | 8/1928 | Root | 15/97.1 |
| 2,882,544 | 4/1959 | Hadidian | 15/201 |
| 4,694,844 | 9/1987 | Berl | 15/201 |
| 5,184,368 | 2/1993 | Holland | 15/201 |
| 5,581,840 | 12/1996 | Chen | 15/201 |

FOREIGN PATENT DOCUMENTS

| | | | |
|---|---|---|---|
| 0689657 | 10/1979 | U.S.S.R. | 15/201 |

*Primary Examiner*—Randall E. Chin
*Attorney, Agent, or Firm*—Fish & Richardson P.C.

[57] ABSTRACT

A brush comprises a sleeve, a cap member, a brushing member, and at least one elastic member. The sleeve has a first end and a second end. The brushing member is movably received in the sleeve at the first end, while the cap member is firmly coupled to the sleeve at the second end. The elastic member is disposed between the cap member and the brushing member so that a portion of the brushing member protrudes from the first end of the sleeve.

7 Claims, 5 Drawing Sheets

SCRUBBER BRUSH

BACKGROUND OF THE INVENTION

1. Field of the Invention:

The present invention relates to a brush of a scrubber and, in particular, to a brush for brushing wafers without scraping them.

2. Description of Prior Art:

Referring to FIG. 1, a scrubber produced by the DNS company and widely used in six-inch-wafer Facilities to brush wafers is shown. The scrubber includes) a rotatable disc 10 for holding a wafer by vacuum; a brush arm 12 having one end supported by a rotatable shaft 122 and the other end provided with a brush 2 to brush the wafer held by the disc 10; a brush-rest 14 on which the brush 2 rests when not in use; a deionized water (DIW) rinse nozzle for spouting deionized water to lubricate the wafer so that the brush 2 moves smoothly over it; a $N_2$-blow nozzle 164 for blowing nitrogen to dry the wafer; and a jet nozzle 18 connected to a rotatable shaft 184 via a jet nozzle arm 182 for spouting water to rinse the wafer.

As shown in FIG. 2 and 3, the brush 2 of the scrubber comprises a sleeve 22, a cap member 24 and a brushing member 26.

The sleeve 22 has a first end 222a and a second end 222b. At the first end 222a, the sleeve 22 is provided with an inner flange 224 for holding the brushing member 26 within the sleeve, and an outer flange 226 which mates with the brush-rest 14 shown in FIG. 1, an arrangement which allows the whole brush 2 to rest on the brush-rest 14 when not in use. At the second end 222b, the inner wall 222 of the sleeve 22 is provided with recesses 228.

On its outer periphery, the cap member 24 has a continuous thread 244 and engaging portions 242. By means of the continuous thread 244, the cap member 24 can be screwed together with the brush arm 12 shown in FIG. 1. By means of the engaging portions 242, the cap member 24 can be attached to the recesses 228 of the sleeve 22.

The brushing member 26, which is received in the sleeve 22, is made of a material, such as polyvinyl acetate (PVA). Also, the brushing member 26 has a first portion 262 and a second portion 264. The diameter of the first portion 262 is greater than that of the second portion 264 so that the first portion 262 is held by the inner flange 224 of the sleeve 22, and the second portion 264 protrudes from the sleeve 22 to brush the wafer.

However, the brush 2 of the prior art has disadvantages. Referring to FIG. 4, if the height of the brush 2 is not properly set with respect to the safer or the surface of the wafer is too uneven, pressure applied to the brushing member 26 will be excessive, causing scraping of the wafer.

SUMMARY OF THE INVENTION

A major object of the present invention is to provide a brush for brushing wafers without scraping them.

In accordance with the object of the present invention, there is provided a brush comprising a sleeve, a cap member, a brushing member, an intermediate plate and at least one elastic member. The sleeve has a first end and a second end. The brushing member is movably received in the sleeve at the first end, while the cap member is firmly coupled to the sleeve at the second end. The intermediate plate is disposed on the brushing member and is provided with at least one opening. The elastic member is disposed against the cap member and the intermediate plate so that a portion of the brushing member protrudes from the first end of the sleeve to brush wafers.

When the wafers are brushed by the brush of this invention, pressure applied to the brushing member can be alleviated by the compression of the elastic member. In addition, portions of the brushing member, when subjected to excessive upward force, can extend through the opening in the intermediate plate, thereby alleviating pressure further. Therefore, problems stemming from excessive pressure applied to the brushing member do not arise, and the brush does not scrape the wafers.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

Figure 5:
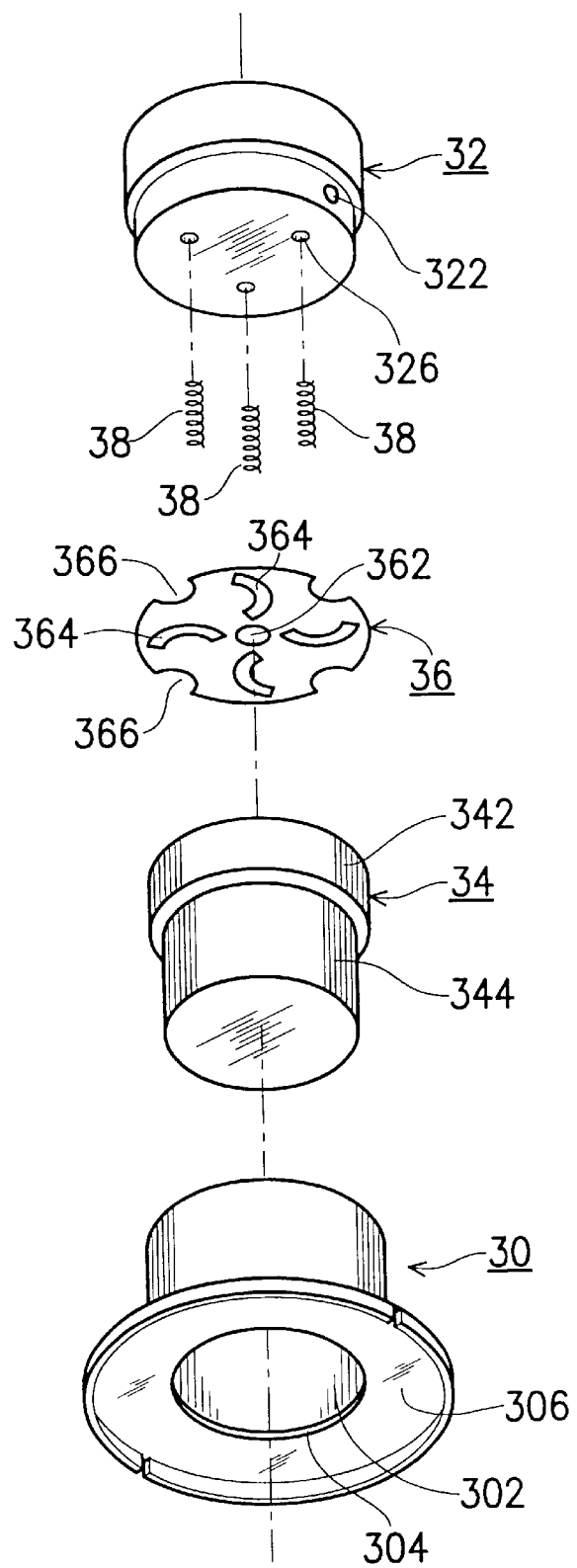
FIG. 5 is a perspective diagram of the brush according to an embodiment of this invention.
Figure 6:
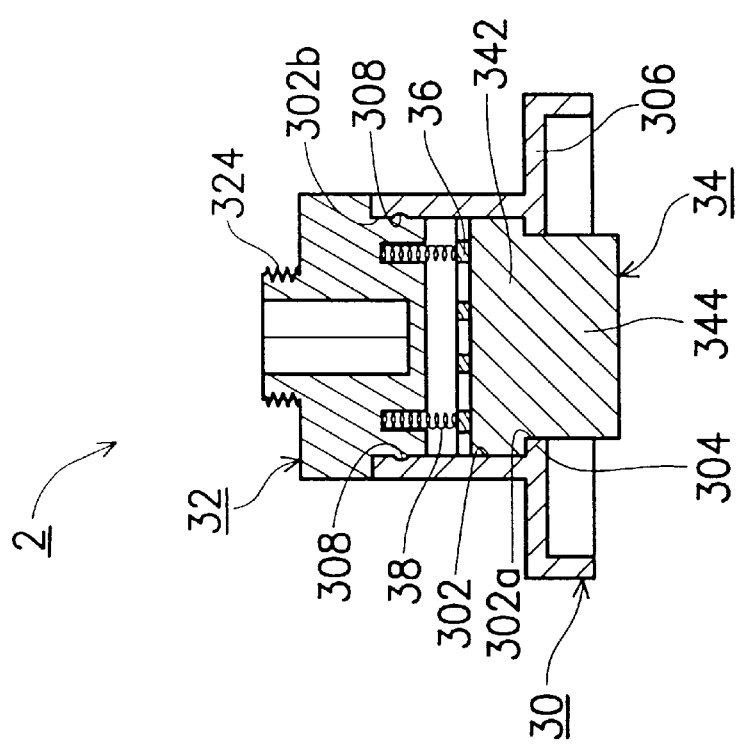
FIG. 6 is a sectional diagram of the brush of FIG. 5.

As shown in FIGS. 5 and 6, the brush according to this invention comprises a sleeve 30, a cap member 32, a brushing member 34, an intermediate plate 36, and spring members 38.

Figure 1:
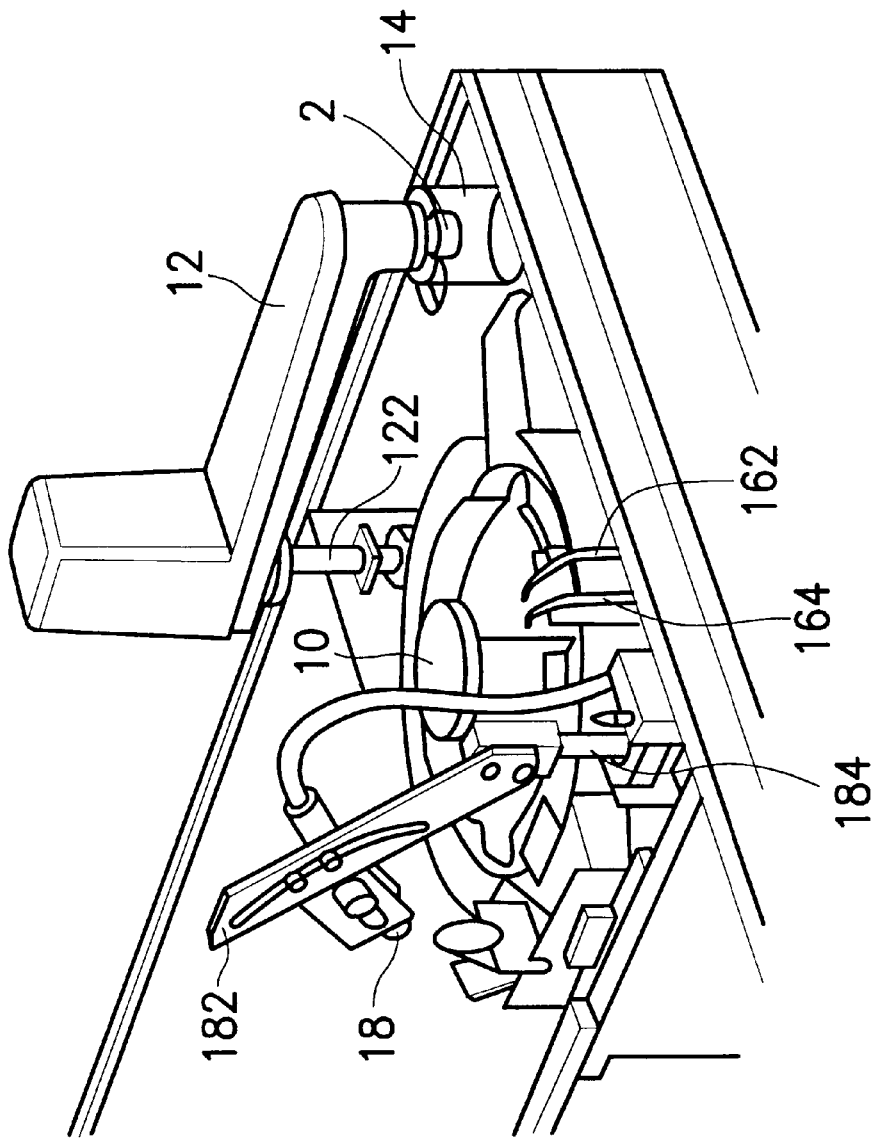
FIG. 1 shows a prior art scrubber.
Figure 2:
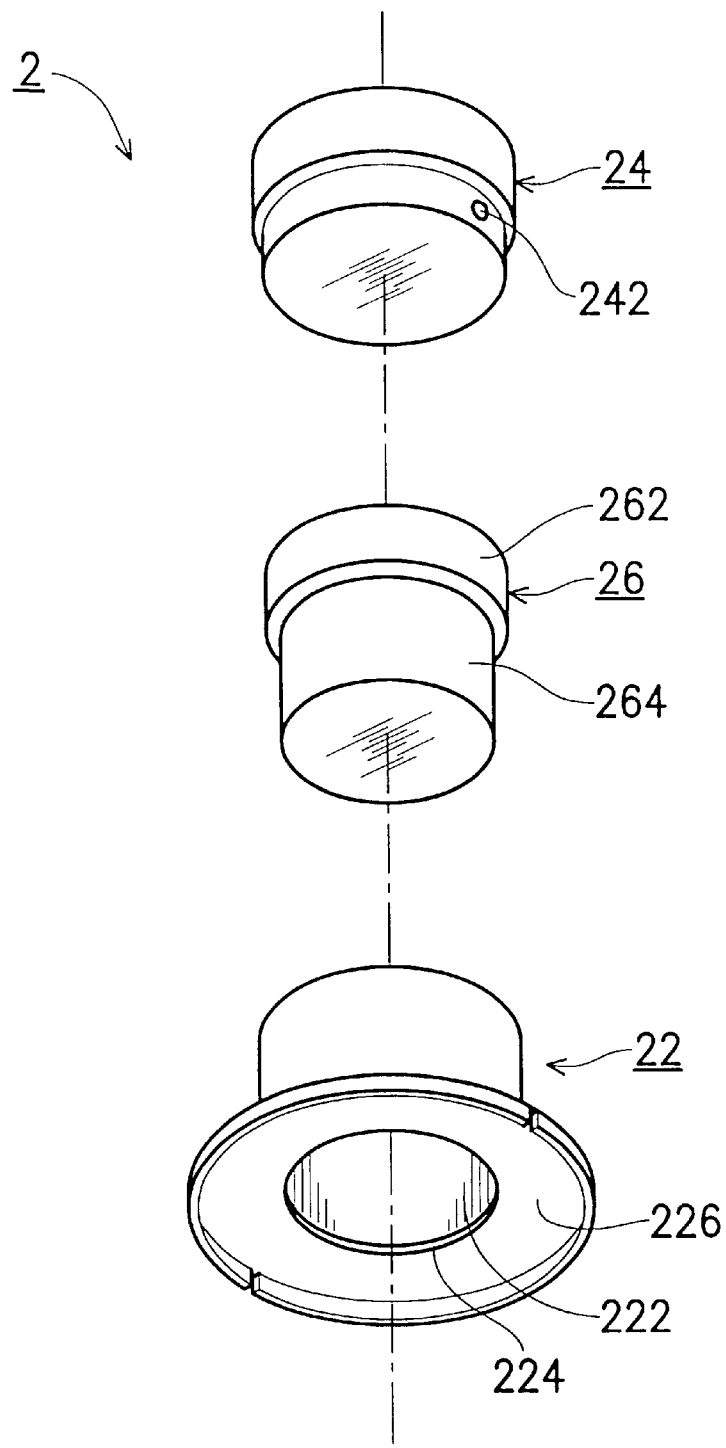
FIG. 2 is a perspective diagram of a brush used in the scrubber of the prior art.
Figure 4:
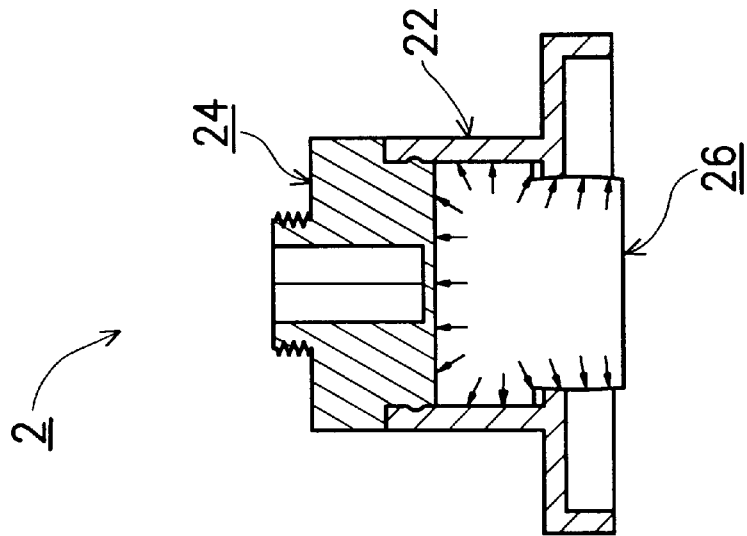
FIG. 4 shows the brush of FIG. 3 under pressure.

The sleeve 30 has a first end 302a and a second end 302b. At the first end 302a, the sleeve 30 is provided with an inner flange 304 for holding the brushing member 34, and an outer flange 306 which mates with the brush-rest 14 shown in FIG. 1, an arrangement which allows the whole brush to rest on the brush-rest 14 when not in use. At the second end 302b, the inner wall 302 of the sleeve 30 is provided with recesses 308.

The cap member 32 is substantially cylindrical with holding holes 326 provided on its end surface to hold the spring members 38. Furthermore, on its outer periphery, the cap member 32 has a continuous thread 324 and engaging portions 322. By means of the continuous thread 324, the cap member 32 can be screwed together with the brush arm 12 shown in FIG. 1. By means of the engaging portions 322, the cap member 32 can engage the recesses 308 of the sleeve 30.

Figure 3:
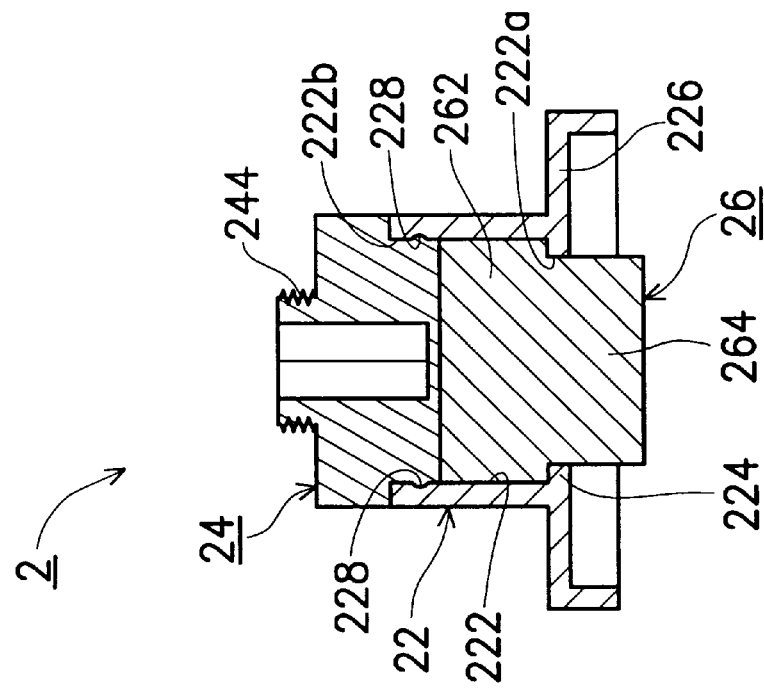
FIG. 3 is a sectional diagram of the brush of FIG. 2.

The brushing member 34, which is received in the sleeve 30, is made of such materials as polyvinyl acetate (PVA) Also, the brushing member 34 has a first portion 342 and a second portion 344. The diameter of the first portion 342 is greater than that of the second portion 344 so that the first portion 342 is held by the inner flange 304 of the sleeve 30, and the second portion 344 protrudes from the sleeve 30 to brush the wafer. Furthermore, the length of the first portion 342 is less than that of the first portion 262 shown in FIG. 3 so that a space is provided between the cap member 32 and the brushing member 34 through which the brushing member 34 can move.

Figure 7:
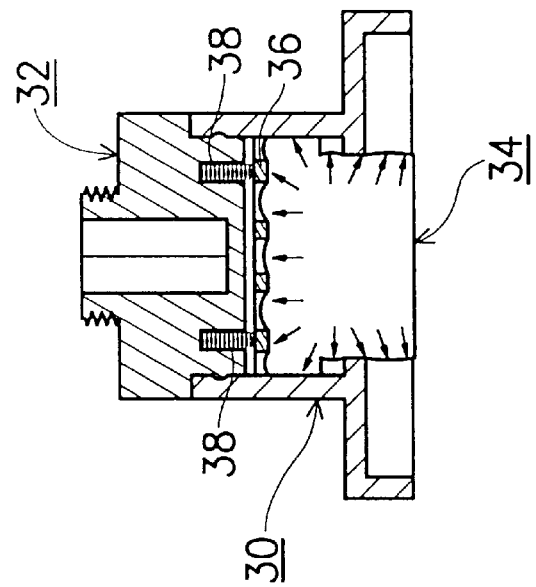
FIG. 7 shows the brush of FIG. 6 under pressure.

The intermediate plate 36 is made of a hard material, for instance a hard plastic, and is disposed on the first portion 342 of the brushing member 34. At least one opening, for example a hole 362, slot 364, and/or gap 366, is provided on the intermediate plate 36 to Correspondingly receive the bulging portions on the upper surface of the first portion 342 of the squeezed brushing member 34, as shown in FIG. 7.

The number of the spring member 38 may be one or more. In this embodiment, it is three. Also, the spring members 38 may be coiled springs. As shown in FIG. 6, the spring members 38 are disposed against the brushing member 34 via the intermediate plate 36 so that the second portion 344 of the brushing member 34 protrudes from the sleeve 30.

When the wafer is brushed by the brush of this invention, the spring members 38 can be compressed to alleviate part of the pressure applied to the brushing member 34. In addition, a portion of the brushing member 34 can bulge from the opening of the intermediate plate 36. Therefore, problems stemming from excessive upward pressure applied to the brushing member 34, for example, from a wafer that has a nonuniform surface or warped wafer, are eliminated.

Although this invention has been described in its preferred forms and various examples with a certain degree of particularity, it is understood that the present disclosure of the preferred forms and the various examples can be changed in the details of construction. The scope of the invention should be determined by the appended claims and not by the specific examples given herein.

What is claimed is:

1. A brush comprising:
   a sleeve having a first end and a second end;
   a brushing member movably received in the sleeve at the first end;
   a cap member firmly coupled to the sleeve at the second end;
   at least one elastic member disposed between the cap member and the brushing member so that a portion of the brushing member protrudes from the first end of the sleeve;
   an intermediate plate disposed between the at least one elastic member and the brushing member and provided with at least one opening.

2. The brush as claimed in claim 1, wherein said at least one opening is a hole.

3. The brush as claimed in claim 1, wherein said at least one opening is a slot.

4. The brush as claimed in claim 1, wherein said at least one opening is a gap.

5. The brush as claimed in claim 1, wherein the at least one elastic member is a spring member that pushes against the cap member and the intermediate plate.

6. The brush as claimed in claim 5, wherein at least one holding hole is provided on the cap member to hold the spring member.

7. The brush as claimed in claim 5, wherein the spring member is a coiled spring.

* * * * *